United States Patent
Cejka et al.

(10) Patent No.: US 10,147,654 B2
(45) Date of Patent: Dec. 4, 2018

(54) PACKAGE MATERIALS MONITOR AND METHOD THEREFOR

(71) Applicant: FREESCALE SEMICONDUCTOR, INC., Austin, TX (US)

(72) Inventors: Stanley Andrew Cejka, Austin, TX (US); Tingdong Zhou, Austin, TX (US)

(73) Assignee: NXP USA, INC., Austin, TX (US)

( * ) Notice: Subject to any disclaimer, the term of this patent is extended or adjusted under 35 U.S.C. 154(b) by 260 days.

(21) Appl. No.: 15/298,368

(22) Filed: Oct. 20, 2016

(65) Prior Publication Data
US 2018/0112972 A1 Apr. 26, 2018

(51) Int. Cl.
*H01L 21/66* (2006.01)
*H01L 23/498* (2006.01)
*H01L 21/48* (2006.01)

(52) U.S. Cl.
CPC .......... *H01L 22/12* (2013.01); *H01L 21/4857* (2013.01); *H01L 23/49822* (2013.01); *H01L 23/49838* (2013.01); *H01L 23/49866* (2013.01); *H01L 23/49894* (2013.01)

(58) Field of Classification Search
CPC .............................. H01L 21/4857; H01L 22/12
USPC .......................................................... 33/834
See application file for complete search history.

(56) References Cited

U.S. PATENT DOCUMENTS

| 4,420,754 | A | * | 12/1983 | Andermo | G01D 5/2415 324/660 |
| 5,091,647 | A | | 2/1992 | Carduner et al. | |
| 5,416,424 | A | * | 5/1995 | Andermo | G01B 3/002 324/684 |
| 5,574,381 | A | * | 11/1996 | Andermo | G01B 3/205 324/660 |
| 6,524,165 | B1 | | 2/2003 | Wiswesser et al. | |
| 6,621,584 | B2 | | 9/2003 | Pecen et al. | |
| 7,052,920 | B2 | | 5/2006 | Ushio et al. | |
| 7,430,982 | B2 | * | 10/2008 | Koivukunnas | G01K 3/04 116/207 |
| 2018/0112972 | A1 | * | 4/2018 | Cejka | H01L 23/49822 |

FOREIGN PATENT DOCUMENTS

| CN | 1168128 C | 9/2004 |
| CN | 1313637 C | 5/2007 |

* cited by examiner

*Primary Examiner* — Yaritza Guadalupe-McCall

(57) ABSTRACT

A stacked monitor structure and method of measuring thicknesses of embedded layers in a build-up substrate is provided. The stacked monitor structure includes a multi-layer substrate having a first shape formed in a first conductive layer of the multi-layer substrate and a second shape formed in a second conductive layer of the multi-layer substrate, a region of the second shape overlapping the first shape. A first dielectric layer is disposed between the first conductive layer and the second conductive layer. A measuring device is configured to measure a thickness of the first conductive layer at a first location on the stacked monitor structure, a thickness of the second conductive layer at a second location on the stacked monitor structure, and a combined thickness of the first conductive layer, the second conductive layer, and the first dielectric layer at a third location on the stacked monitor structure.

20 Claims, 4 Drawing Sheets

PACKAGE MATERIALS MONITOR AND METHOD THEREFOR

BACKGROUND

Field

This disclosure relates generally to semiconductor device packaging, and more specifically, to semiconductor device packaging materials monitor.

Related Art

Packaged semiconductor devices are often found in a large spectrum of electronic products—from sewing machines to washing machines, from automobiles to cellular telephones, and so on. These packaged semiconductor devices typically include a semiconductor die mounted on a substrate having embedded interconnections between the semiconductor die and a printed circuit board. As the performance of the semiconductor devices increase, signals are expected to propagate at faster speeds through the interconnections. However, fluctuations in the thickness, spacing, and other parameters of the interconnections can affect the overall performance of the semiconductor devices. Attempts to monitor and control these fluctuations have proven to be challenging.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a stacked monitor structure and method of non-destructively measuring thicknesses of embedded layers in a build-up substrate. A set of monitor shapes are arranged in a stair-step like pattern having portions of the monitor shapes overlap. Each monitor shape is formed in a respective conductive layer of the build-up substrate and includes a first region which overlaps another monitor shape and a second region which does not overlap another monitor shape or is overlapped by another monitor shape. A measuring device such as a laser caliper can be used to measure thicknesses of individual conductive layers as well as a combination of conductive layers isolated by interlayer dielectrics. Interlayer dielectric thicknesses can be determined by subtracting the individual conductive layer thicknesses from the combination of conductive layers thickness.

The stacked monitor structure and measurement techniques are useful to monitor the quality of semiconductor package substrates such as those used in flip-chip plastic ball grid array (FCPGA) packaged devices, for example, without destroying, delaminating, or de-processing the substrate. By monitoring layer thickness, signal communication speeds through the substrate can be effectively controlled.

Figure 1:
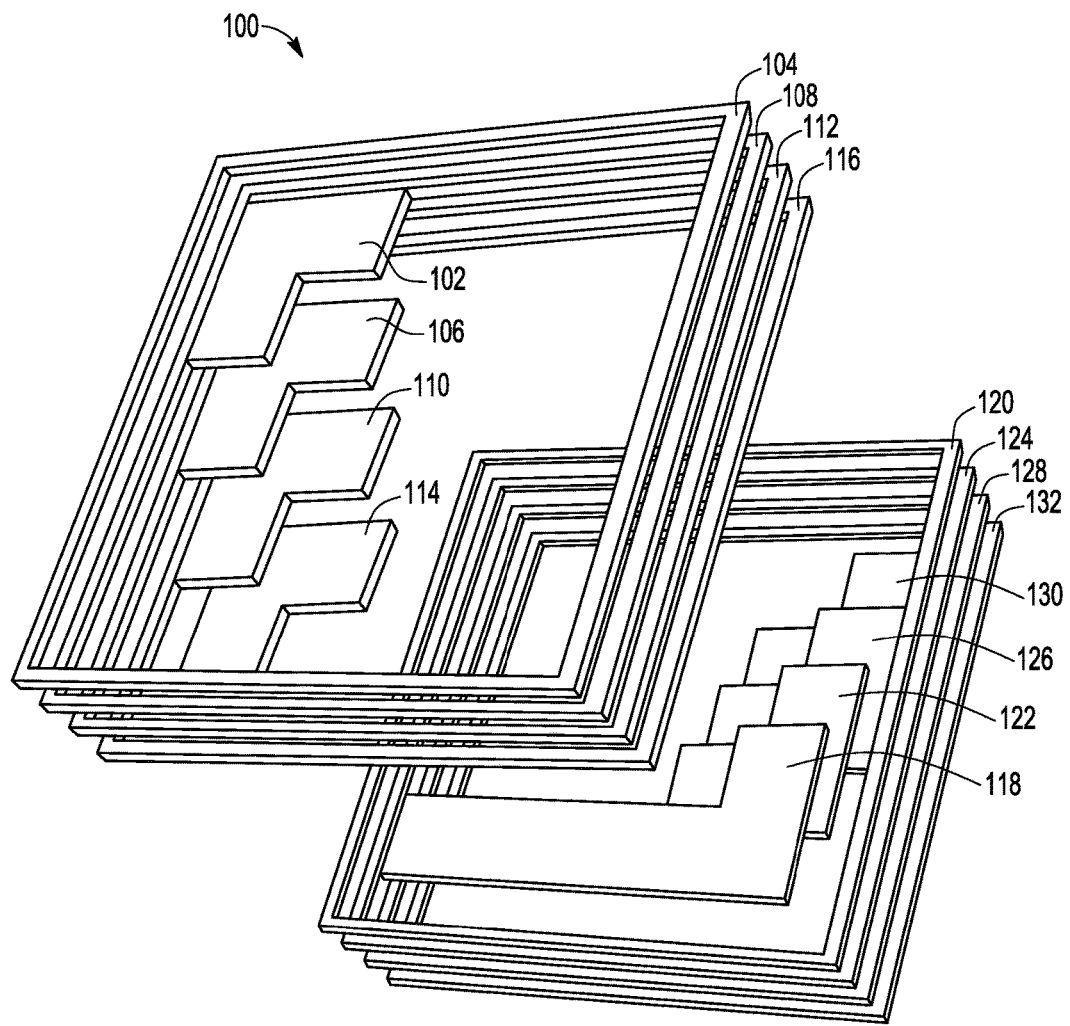
FIG. 1 illustrates, in a simplified perspective view, an exemplary stacked monitor structure according to an embodiment of the present disclosure.

FIG. 1 illustrates, in a simplified perspective view, an exemplary stacked monitor structure 100 according to an embodiment of the present disclosure. The stacked monitor structure 100 includes an arrangement of overlapping monitor shapes 102, 106, 110, 114, 118, 122, 126, and 130 with each shape formed in respective conductive layers 104, 108, 112, 116, 120, 124, 128, and 132. The conductive layers, including monitor shapes, along with interlayer dielectrics (e.g., 310, 328-342 in FIG. 3) form a build-up substrate whereby a semiconductor die can be mounted in a flip-chip configuration, for example. Accordingly, monitor shapes 102, 106, 110, 114, 118, 122, 126, and 130 are formed in the same plane as respective conductive layers 104, 108, 112, 116, 120, 124, 128, and 132 of the build-up substrate.

Conductive layers 104, 108, 112, 116, 120, 124, 128, and 132 can be deposited layers to provide an electrical connectivity between the bonding pads (e.g., 320 FIG. 3) of a flip-chip mounted semiconductor die and external package ball pads (e.g., 326 FIG. 3)) formed on the build-up substrate. Conductive layers 104, 108, 112, 116, 120, 124, 128, and 132 can include materials such as metal, metal alloy, doped semiconductor, semi-metals, or combinations thereof as known in the art (e.g., amorphous silicon, doped polysilicon, aluminum, copper, silver, gold, tantalum, titanium, tungsten, or any metal alloy, nitride or silicide). Through the use of conductive layers 104, 108, 112, 116, 120, 124, 128, and 132, any number of bonding pads formed on the flip-chip mounted semiconductor die can be interconnected in any combination to the package ball pads.

Insulating dielectric layers (e.g., 310, 328-342 FIG. 3) can be made from polyimide and organic polymers, for example, in liquid or dry film and can include a wide range of other materials used for interlayer dielectrics as known in the art (e.g., silicon dioxide, silicon nitride, silicon oxynitride, or any combination of such layers providing electrical isolation).

In some embodiments, the build-up formed substrate may include a core layer (e.g., 310 FIG. 3) formed from a glass epoxy material, for example. One or more stacked monitor structures like stacked monitor structure 100 may be located in suitable locations within the build-up substrate such that the conductive layers and intervening dielectric layers of the substrate can be monitored for quality control for example. The term monitor shape, as used herein, generally refers to a geometric shape formed such that a physical property such as layer thickness can be non-destructively measured and monitored.

Each monitor shape of the stacked monitor structure 100 is formed in a conductive layer. For example, monitor shape 102 is formed in conductive layer 104. Conductive layer 104 shown as a rectangular ring, as well as other conductive layers of the substrate, may extend outward in all four directions providing interconnect, for example, depending upon the placement of the stacked monitor structure 100 within the build-up substrate. Each monitor shape includes a first region or portion which overlaps another monitor shape or is overlapped by another monitor shape, and a second region or portion which does not overlap another monitor shape and is not overlapped by another monitor shape. For example, a first region of monitor shape 102 overlaps a first region of monitor shape 106, and a second region of monitor shapes 102 and 106 do not overlap another shape and are not overlapped by another shape. Because a region of monitor shapes 102 and 106 do not overlap another shape and are not overlapped by another shape, a thickness of each shape 102 and 106 (and conductive layers 104 and 108) can be measured individually. And because a region of monitor shape 102 overlaps a region of monitor shape 106, a thickness of the combined overlap region can be measured. By subtracting the individually measured thicknesses of monitor shapes 102 and 106 from the thickness of the combined overlap region, a thickness of an intervening dielectric layer (e.g., 330 FIG. 3) can be determined.

Monitor shapes 102, 106, 110, 114, 118, 122, 126, and 130 may be formed in a variety of shapes such as rectangles, squares, and other orthogonal shapes for example. In the exemplary stacked monitor structure 100, each monitor shaped is formed in an "L" shape allowing for a compact arrangement of overlapping monitor shapes 102, 106, 110, 114, 118, 122, 126, and 130. Monitor shapes (102, 106, 110, 114, 122, 126, and 130) shown in FIG. 1 have arms of substantially equal lengths and substantially equal widths. In this embodiment, monitor shape 118 has one arm significantly longer that the other, allowing for the arrangement of overlapping monitor shapes to be folded into a substantially square shaped arrangement. Monitor shapes may be formed with any dimensions suitable for thickness measurements with a measuring device. For example, monitor shapes 102, 106, 110, 114, 122, 126, and 130 each may have arm lengths of approximately 200 microns and widths of approximately 100 microns, depending upon measuring device requirements.

Figure 2:
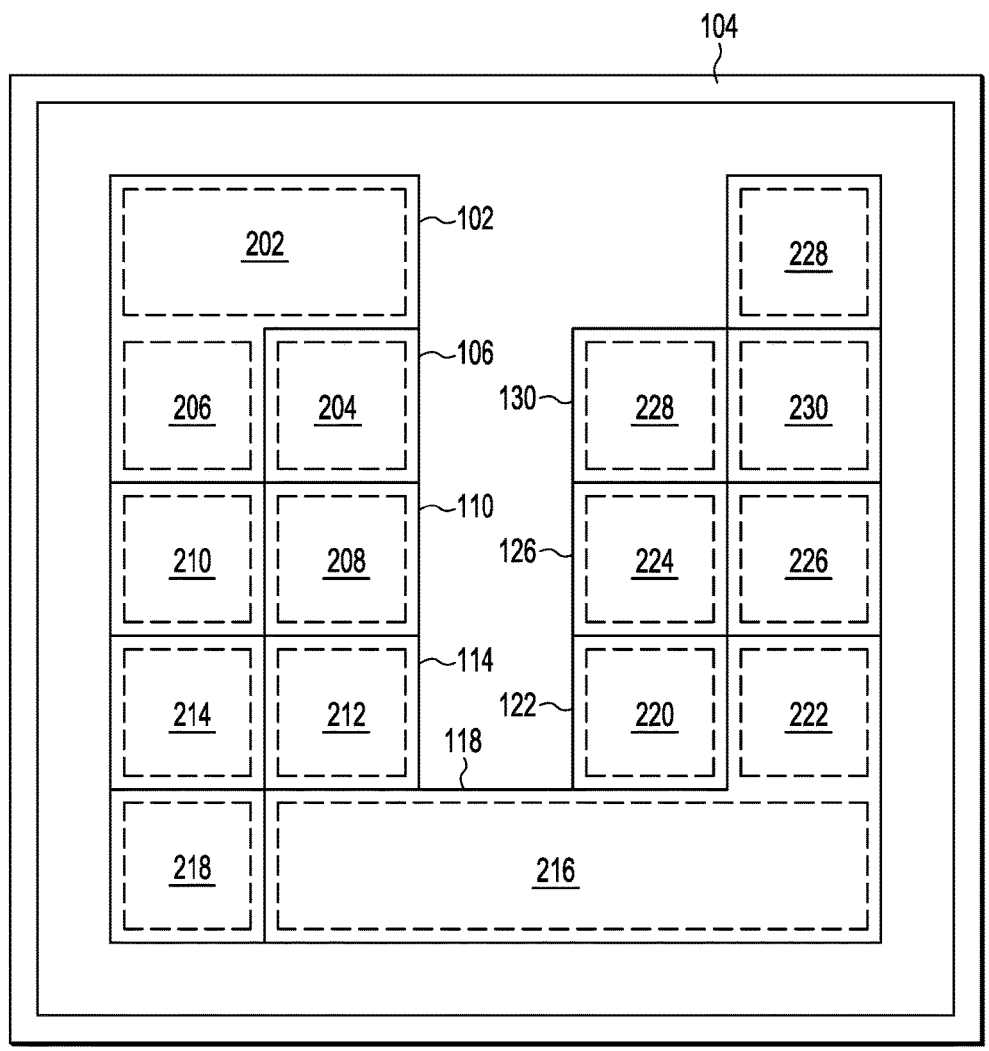
FIG. 2 illustrates, in a simplified plan view, the exemplary stacked monitor structure according to an embodiment of the present disclosure.

FIG. 2 illustrates, in a simplified plan view, the exemplary stacked monitor structure 100 according to an embodiment of the present disclosure. As illustrated in the plan view of the exemplary stacked monitor structure 100, a first region or portion 202, 204, 208, 212, 216, 220, 224, and 228 of monitor shapes 102, 106, 110, 114, 118, 122, 126, and 130 does not overlap another shape and is not overlapped by another shape. Because first regions of respective monitor shapes do not overlap another shape and are not overlapped by another shape, a thickness of each monitor shape can be measured individually. A second region 206, 210, 214, 218, 222, 226, and 230 of monitor shapes 102, 106, 110, 114, 118, 122, and 126 overlaps a second region of one of the other monitor shapes. Because second regions of respective monitor shapes overlap another monitor shape, a thickness at the combined overlap region can be measured.

For example, a first region or portion 202 of monitor shape 102 does not overlap another shape and is not overlapped by another shape. Likewise, a first region 204 of monitor shape 106 does not overlap another shape and is not overlapped by another shape. A second region 206 of monitor shape 102 overlaps a second region of monitor shape 106. Because first regions 202 and 204 of respective monitor shapes 102 and 106 do not overlap another shape and are not overlapped by another shape, a thickness of each monitor shape 102 and 106 (and respective conductive layers 104 and 108) can be measured individually. And because second region 206 of monitor shape 102 overlaps second region of monitor shape 106, a thickness at the combined overlap region 206 can be measured. By subtracting the individually measured thicknesses of monitor shapes 102 and 106 from the thickness at the combined overlap region 206, a thickness of an intervening dielectric layer (e.g., 330 FIG. 3) can be determined.

Figure 3:
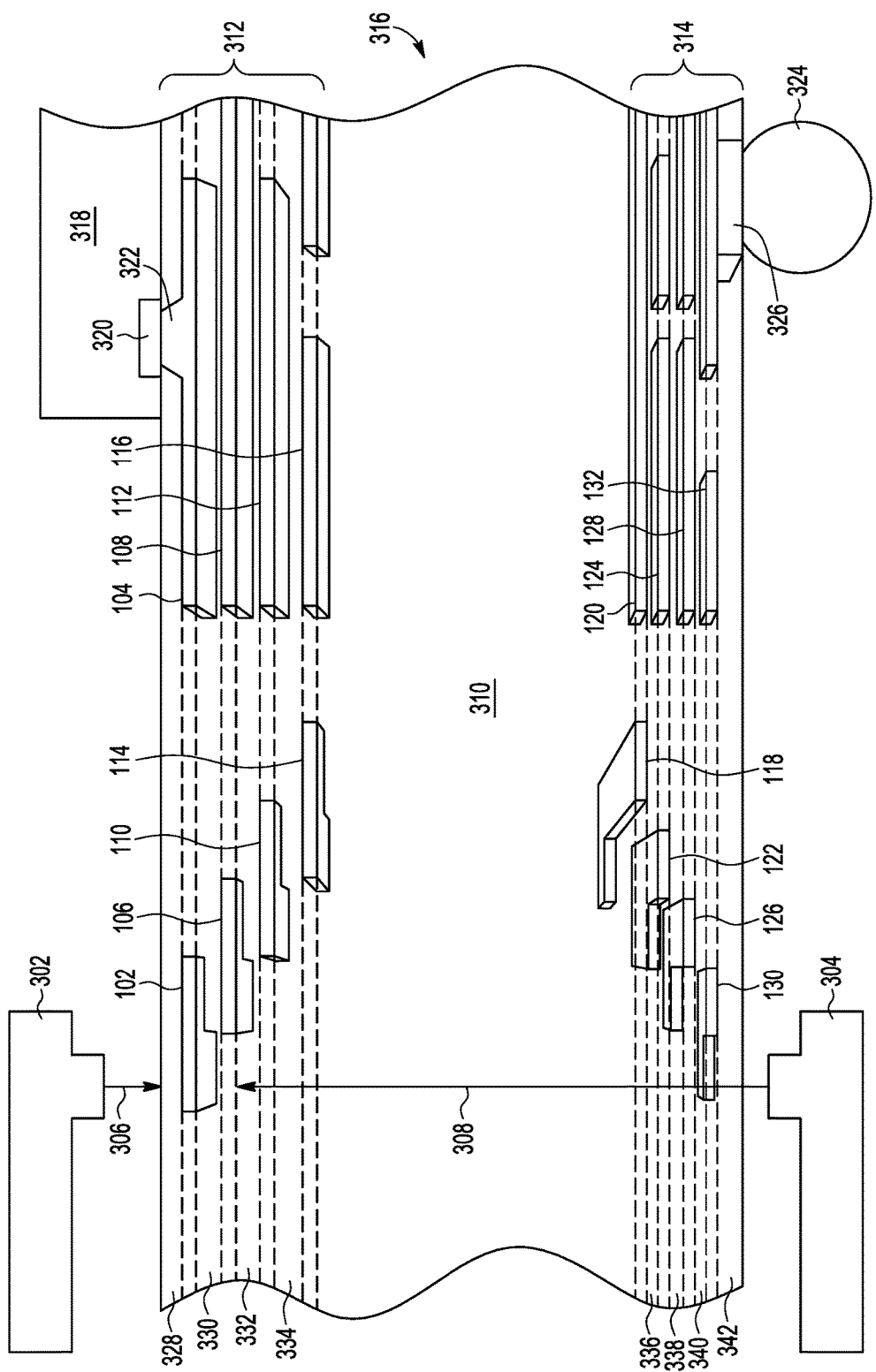
FIG. 3 illustrates, in a simplified cross-sectional perspective view, an exemplary measuring device at a location at stacked monitor structure according to an embodiment of the present disclosure.

FIG. 3 illustrates, in a simplified cross-sectional perspective view, an exemplary measuring device (302, 304) at a location on stacked monitor structure 100 according to an embodiment of the present disclosure. The exemplary stacked monitor structure 100 is shown in formed build-up substrate 316 with semiconductor die 318 mounted in a flip-chip configuration. Each monitor shape is formed in respective conductive layers (104, 108, 112, 116, 120, 124, 128, and 132) and isolated from one another with one or more interlayer dielectric layers (310, 328-342). In this embodiment, a core layer 310 is depicted with monitor shapes 114 and 118 and respective conductive layers 116 and 120 formed on top and bottom surfaces. Top-side build-up layers 312 of the build-up substrate 316 are formed above core layer 310, and bottom-side build-up layers 314 of the build-up substrate 316 are formed below core layer 310.

Measuring device 302, 304 may be any suitable device capable of measuring a thickness of one or more layers. In this embodiment, measuring device 302, 304 is a laser caliper device which can irradiate a target location (such as regions 202-206 in FIG. 2) on build-up substrate 316 with laser energy 306, 308 and determine a thickness at the target location. Known suitable measuring devices may use electromagnetic waves, radio waves, x-rays, and other forms of irradiation to non-destructively measure a thickness of one or more layers embedded in build-up substrate 316.

Semiconductor die 318 is mounted to build-up substrate 316 in a flip-chip configuration. As illustrated, one of the bonding pads 320 formed on semiconductor die 318 is electrically coupled to a bonding site 322 formed at a top surface of build-up substrate 316. As illustrated, one of conductive balls 324 can be formed or attached at one of the ball pads 326 formed at a bottom surface of build-up substrate 316 using known techniques and materials. It can be realized that conductive pathways formed with conductive layers 104, 108, 112, 116, 120, 124, 128, and 132 and interconnecting vias (not shown) enables electrical connections between bond pads 320 and conductive balls 324.

Figure 4:
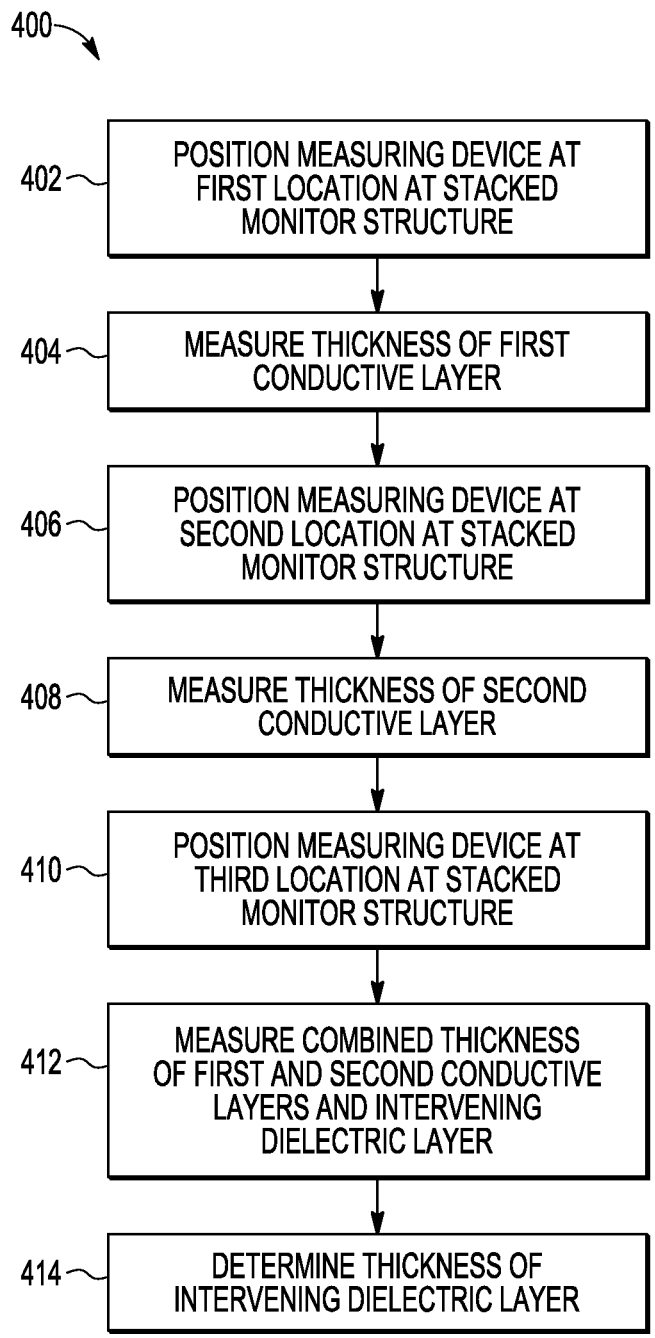
FIG. 4 illustrates, in a flow-chart diagram form, a simplified layer thickness measurement flow in accordance with an embodiment of the present disclosure.

FIG. 4 illustrates, in a flow-chart diagram form, a simplified layer thickness measurement flow in accordance with an embodiment of the present disclosure. Measuring device 302, 304 is positioned at locations on the stacked monitor structure 100 of the build-up substrate 316 such that individual conductive layer thicknesses and combined thicknesses can be measured. In some embodiments, the measuring device is moved to the locations while the build-up substrate remains relatively static when taking measurements. In some embodiments, while the measuring device remains relatively static, the build-up substrate is moved to the locations when taking measurements.

At step 402, measuring device 302, 304 is positioned at a first location (e.g., 202 FIG. 2) on the stacked monitor structure 100 of build-up substrate 316. The first location may correspond to region 202 as shown in FIG. 2 where monitor shape 102 does not overlap another shape and is not overlapped by another shape.

At step 404, measuring device 302, 304 irradiates monitor shape 102 at the first location with laser light and generates a thickness measurement of monitor shape 102 by measuring to/from both top and bottom surfaces of monitor shape 102. Because monitor shape 102 is formed in conductive layer 104, the thickness measurement is representative of the conductive layer 104 as well.

At step 406, measuring device 302, 304 is positioned at a second location (e.g., 204 FIG. 2) on the stacked monitor structure 100 of build-up substrate 316. The second location may correspond to region 204 as shown in FIG. 2 where monitor shape 106 does not overlap another shape and is not overlapped by another shape.

At step 408, measuring device 302, 304 irradiates monitor shape 106 at the second location with laser light and generates a thickness measurement of monitor shape 106 by measuring to/from both top and bottom surfaces of monitor shape 106. Because monitor shape 106 is formed in conductive layer 108, the thickness measurement is representative of the conductive layer 108 as well.

At step 410, measuring device 302, 304 is positioned at a third location (e.g., 206 FIG. 2) on the stacked monitor structure 100 of build-up substrate 316. The third location may correspond to region 206 as shown in FIG. 2 where monitor shape 102 overlaps a region of monitor shape 106. Because monitor shape 102 and conductive layer 104 are isolated from underlying monitor shape 106 and conductive layer 108 by a dielectric layer (e.g., 330 FIG. 3), a thickness of the combined layers at overlap region 206 can be measured by measuring to/from both top surface of monitor shape 102 and bottom surface of monitor shape 106.

At step 412, measuring device 302, 304 irradiates a top surface of monitor shape 102 and a bottom surface of monitor shape 106 at the third location with laser light and generates a thickness measurement of combined layers including monitor shapes 102 and 106, and intervening dielectric layer.

At step 414, a thickness of the intervening dielectric layer is determined. Because the thickness of monitor shape 102 was measured at step 404 and the thickness of monitor shape 106 was measured at step 408, the thickness of the intervening dielectric layer is determined by subtracting thicknesses of monitor shapes 102 and 106 from the combined layers thickness measurement at step 412.

Subsequent monitor shapes and intervening dielectric layers can be measured and determined in a similar manner as provided in the preceding steps.

Generally, there is provided, a stacked monitor structure including a multi-layer substrate; a first shape formed in a first conductive layer of the multi-layer substrate; a second shape formed in a second conductive layer of the multi-layer substrate, a region of the second shape overlapping the first shape; a first dielectric layer disposed between the first conductive layer and the second conductive layer; and a measuring device configured to measure a thickness of the first conductive layer at a first location on the stacked monitor structure, a thickness of the second conductive layer at a second location on the stacked monitor structure, and a combined thickness of the first conductive layer, the second conductive layer, and the first dielectric layer at a third location on the stacked monitor structure. The measuring device configured to measure a thickness may be configured to non-destructively measure a thickness. The first dielectric may be formed from a non-crystalline organic material. The first shape and the second shape may be characterized as "L" shapes formed with substantially similar width and length dimensions. The third location may correspond to the region of the second shape overlapping the first shape. The first and second conductive layers may include a copper (Cu) material. The measuring device may further include a laser caliper. The multi-layer substrate may further include a core layer formed from a glass epoxy material. The multi-layer substrate may further include bonding sites for attaching a semiconductor die in a flip-chip configuration, at least one of the bonding sites electrically coupled to the first conductive layer.

In another embodiment, there is provided, a method including providing a stacked monitor structure including: a multi-layer substrate; a first shape formed in a first conductive layer of the multi-layer substrate; a second shape formed in a second conductive layer of the multi-layer substrate, a portion of the second shape overlapping the first shape; and a first dielectric layer disposed between the first conductive layer and the second conductive layer; measuring a thickness of the first conductive layer with a measuring device at a first location of the stacked monitor structure; measuring a thickness of the second conductive layer with the measuring device at a second location of the stacked monitor structure; and determining a thickness of the first dielectric layer based on the thickness of the first conductive layer and the second conductive layer. The method may further include measuring a combined thickness of the first conductive layer, the second conductive layer, and the first dielectric layer at a third location of the stacked monitor structure. Measuring a thickness of the first conductive layer and the second conductive layer may be characterized as non-destructive measuring. The first shape and the second shape may be characterized as "L" shapes formed with substantially similar width and length dimensions. The first and second conductive layers may include a copper (Cu) material. The first dielectric layer may include a resin or epoxy material.

In yet another embodiment, there is provided, a stacked monitor structure embedded in a build-up substrate including a first shape formed in a first conductive layer of the build-up substrate; a second shape formed in a second conductive layer of the build-up substrate, a portion of the second shape overlapping the first shape; a first dielectric layer disposed between the first conductive layer and the second conductive layer; and a measuring device configured to non-destructively measure a thickness of the first conductive layer at a first location on the stacked monitor structure, a thickness of the second conductive layer at a second location on the stacked monitor structure, and a combined thickness of the first conductive layer, the second conductive layer, and the first dielectric layer at a third location on the stacked monitor structure, a thickness of the first dielectric layer determined based on the thickness of the first conductive layer and the second conductive layer. The first dielectric may be formed from a non-crystalline organic material. The first shape and the second shape may be characterized as "L" shapes formed with substantially similar width and length dimensions. The third location may correspond to the portion of the second shape overlapping the first shape. The multi-layer substrate may further include bonding sites for attaching a semiconductor die in a flip-chip configuration, at least one of the bonding sites electrically coupled to the first conductive layer.

By now it should be appreciated that a stacked monitor structure and method of non-destructively measuring thicknesses of embedded layers in a build-up substrate is provided. A set of monitor shapes are arranged in a stair-step like pattern having portions of the monitor shapes overlap. Each monitor shape is formed in a respective conductive layer of the build-up substrate and includes a first region which overlaps another monitor shape and a second region which does not overlap another monitor shape or is overlapped by another monitor shape. A measuring device such as a laser caliper can be used to measure thicknesses of individual conductive layers as well as a combination of conductive layers isolated by interlayer dielectrics. Interlayer dielectric thicknesses can be determined by subtracting the individual conductive layer thicknesses from the combination of conductive layers thickness.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A stacked monitor structure comprising:
   a multi-layer substrate;
   a first shape formed in a first conductive layer of the multi-layer substrate;
   a second shape formed in a second conductive layer of the multi-layer substrate, a region of the second shape overlapping the first shape;
   a first dielectric layer disposed between the first conductive layer and the second conductive layer; and
   a measuring device configured to measure a thickness of the first conductive layer at a first location on the stacked monitor structure, a thickness of the second conductive layer at a second location on the stacked monitor structure, and a combined thickness of the first conductive layer, the second conductive layer, and the first dielectric layer at a third location on the stacked monitor structure.

2. The stacked monitor structure of claim 1, wherein a measuring device configured to measure a thickness is configured to non-destructively measure a thickness.

3. The stacked monitor structure of claim 1, wherein the first dielectric is formed from a non-crystalline organic material.

4. The stacked monitor structure of claim 1, wherein the first shape and the second shape are characterized as "L" shapes formed with substantially similar width and length dimensions.

5. The stacked monitor structure of claim 1, wherein the third location corresponds to the region of the second shape overlapping the first shape.

6. The stacked monitor structure of claim 1, wherein the first and second conductive layers comprise a copper (Cu) material.

7. The stacked monitor structure of claim 1, wherein the measuring device further comprises a laser caliper.

8. The stacked monitor structure of claim 1, wherein the multi-layer substrate further comprises a core layer formed from a glass epoxy material.

9. The stacked monitor structure of claim 1, wherein the multi-layer substrate further includes bonding sites for attaching a semiconductor die in a flip-chip configuration, at least one of the bonding sites electrically coupled to the first conductive layer.

10. A method comprising:
    providing a stacked monitor structure including:
       a multi-layer substrate;
       a first shape formed in a first conductive layer of the multi-layer substrate;
       a second shape formed in a second conductive layer of the multi-layer substrate, a portion of the second shape overlapping the first shape; and
       a first dielectric layer disposed between the first conductive layer and the second conductive layer;
    measuring a thickness of the first conductive layer with a measuring device at a first location of the stacked monitor structure;
    measuring a thickness of the second conductive layer with the measuring device at a second location of the stacked monitor structure; and
    determining a thickness of the first dielectric layer based on the thickness of the first conductive layer and the second conductive layer.

11. The method of claim 10, further comprising measuring a combined thickness of the first conductive layer, the second conductive layer, and the first dielectric layer at a third location of the stacked monitor structure.

12. The method of claim 10, wherein measuring a thickness of the first conductive layer and the second conductive layer is characterized as non-destructive measuring.

13. The method of claim 10, wherein the first shape and the second shape are characterized as "L" shapes formed with substantially similar width and length dimensions.

14. The method of claim 10, wherein the first and second conductive layers comprise a copper (Cu) material.

15. The method of claim 10, wherein the first dielectric layer comprises a resin or epoxy material.

16. A stacked monitor structure embedded in a build-up substrate, comprising:
    a first shape formed in a first conductive layer of the build-up substrate;
    a second shape formed in a second conductive layer of the build-up substrate, a portion of the second shape overlapping the first shape;
    a first dielectric layer disposed between the first conductive layer and the second conductive layer; and
    a measuring device configured to non-destructively measure a thickness of the first conductive layer at a first location on the stacked monitor structure, a thickness of the second conductive layer at a second location on the stacked monitor structure, and a combined thickness of the first conductive layer, the second conductive layer, and the first dielectric layer at a third location on the stacked monitor structure, a thickness of the first dielectric layer determined based on the thickness of the first conductive layer and the second conductive layer.

17. The stacked monitor structure of claim 16, wherein the first dielectric is formed from a non-crystalline organic material.

18. The stacked monitor structure of claim 16, wherein the first shape and the second shape are characterized as "L" shapes formed with substantially similar width and length dimensions.

19. The stacked monitor structure of claim 16, wherein the third location corresponds to the portion of the second shape overlapping the first shape.

20. The stacked monitor structure of claim 16, wherein the multi-layer substrate further includes bonding sites for attaching a semiconductor die in a flip-chip configuration, at least one of the bonding sites electrically coupled to the first conductive layer.

* * * * *